United States Patent
Lee et al.

(10) Patent No.: US 7,557,039 B2
(45) Date of Patent: Jul. 7, 2009

(54) METHOD FOR FABRICATING CONTACT HOLE OF SEMICONDUCTOR DEVICE

(75) Inventors: Sang-Oh Lee, Kyoungki-do (KR); Sung-Kwon Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 203 days.

(21) Appl. No.: 11/479,242

(22) Filed: Jun. 29, 2006

(65) Prior Publication Data

US 2007/0148942 A1 Jun. 28, 2007

(30) Foreign Application Priority Data

Dec. 22, 2005 (KR) .................. 10-2005-0127656

(51) Int. Cl.
*H01L 21/44* (2006.01)

(52) U.S. Cl. .................. 438/672; 438/620; 438/637; 438/700; 257/E21.577; 257/E21.585

(58) Field of Classification Search .................. 438/942
See application file for complete search history.

(56) References Cited

U.S. PATENT DOCUMENTS

| | | | | |
|---|---|---|---|---|
| 6,503,829 B2 * | 1/2003 | Kim et al. | | 438/637 |
| 6,649,503 B2 * | 11/2003 | Kim et al. | | 438/595 |
| 2005/0064727 A1 * | 3/2005 | Lee et al. | | 438/781 |
| 2006/0043598 A1 * | 3/2006 | Kirby et al. | | 257/774 |
| 2006/0063378 A1 * | 3/2006 | Lin et al. | | 438/642 |
| 2006/0125109 A1 * | 6/2006 | Kirby et al. | | 257/774 |
| 2006/0258145 A1 * | 11/2006 | Lee et al. | | 438/618 |

FOREIGN PATENT DOCUMENTS

KR   1996-0042963   12/1996
KR   2001-0087491   9/2001

* cited by examiner

*Primary Examiner*—Walter L Lindsay, Jr.
*Assistant Examiner*—Cheung Lee
(74) *Attorney, Agent, or Firm*—Blakely, Sokoloff, Taylor & Zafman LLP

(57) ABSTRACT

A method for forming a contact hole of a semiconductor device includes: forming a lower pattern over a substrate; forming a spin-on-glass (SOG) layer over the lower pattern; performing a first curing process on the SOG layer; forming an opening exposing a portion of the SOG layer; performing a second curing process on the SOG layer corresponding to a lower portion of the opening; and forming a contact hole exposing the lower pattern.

13 Claims, 10 Drawing Sheets

METHOD FOR FABRICATING CONTACT HOLE OF SEMICONDUCTOR DEVICE

FIELD OF THE INVENTION

The present invention relates to a method for fabricating a semiconductor device; and more particularly, to a method for fabricating a contact hole of a highly integrated dynamic random access memory (DRAM) device.

DESCRIPTION OF RELATED ARTS

As fabrication technology of semiconductor devices has been developed, the scale of device integration has also increased; and thus, a design rule has deceased as well. Accordingly, a distance between conductive layers adjacent to each other over an identical layer is reduced and thus, an aspect ratio, which is a ratio of an area to a height of a gap between the conductive layers is increased. Therefore, a method to fill the gap having a high aspect ratio between the conductive layers is required.

Particularly, as an inter-layer insulation layer filling the gap having the high aspect ratio, a borophosphosilicate glass (BPSG) layer or a high density plasma (HDP) oxide layer is used. However, in case of depositing the BPSG layer, a high temperature process performed at approximately 800° C. or higher is required. In case of depositing the HDP oxide layer, a gap-filling property is degraded if an aspect ratio is equal to or more than approximately 2.5.

FIG. 1 illustrates a sectioned substrate structure with a degraded gap-filling property. Particularly, when a semiconductor device has an aspect ratio of approximately 2.5 or more, a gap-filling property of a high density plasma (HDP) layer is more likely to be degraded.

If a HDP oxide layer 3 is deposited over a substrate 1, provided with a plurality of conductive layers 2 with an aspect ratio of approximately 2.5 or more, a void may be generated within the HDP oxide layer 3. That is, the gap-filling property of the HDP oxide layer 3 is degraded.

Accordingly, a spin-on-glass (SOG) layer can be used as an inter-layer insulation layer. Since the SOG layer exists in a liquid state at a room temperature, a gap-filling property of the SOG layer is good; however, densification should be performed through a curing process.

FIG. 2 illustrates a micrographic transmission electron microscopy (TEM) image of a typical SOG layer after a wet etching process.

Since a lower portion of the SOG layer is less densified than a upper portion of the SOG layer, an etching speed gets much faster in the lower portion of the SOG layer than in the upper portion of the SOG layer during a subsequent wet etching process performed to form a contact hole in the SOG layer. The etching process is performed much faster in the direction of a Y axis than in the direction of an X axis.

FIGS. 3A to 3F are cross-sectional views illustrating a typical method for fabricating a contact plug of a highly integrated semiconductor device using a SOG layer.

As shown in FIG. 3A, a SOG layer 13 is formed as an inter-layer insulation layer over a substrate 11, provided with a plurality of conductive layers 12. A curing process is performed to densify the SOG layer 13. As described above, during the curing process, a lower portion of the SOG layer 13 is less densified than an upper portion of the SOG layer 13. Accordingly, the lower portion of the SOG layer 13 lacks a resistance to the wet etching compared to the upper portion of the SOG layer 13. Thus, during the wet etching process, the etching process is performed much faster in the lower portion of the SOG layer 13 than in the upper portion of the SOG layer 13.

As shown in FIG. 3B, a hard mask material 14 formed with amorphous carbon is formed over the SOG layer 13. Afterwards, a photo-exposure process is performed and thus, a photoresist pattern 15 is formed over the hard mask material 14. Typically, the hard mask material 14 (e.g., the amorphous carbon) is formed through a low temperature process and thus, has low adhesion to the SOG layer 13. Accordingly, during a subsequent cleaning process and a subsequent wet etching process, a lifting phenomenon may be induced at an interface between the SOG layer 13 and the hard mask material 14.

As shown in FIG. 3C, an etching process 16 using a plasma is performed to etch the hard mask material 14 (see FIG. 3B) exposed between the photoresist pattern 15. After this etching process 16, a hard mask pattern 14A is obtained. As a result, a first contact hole 17 exposing a predetermined portion of the SOG layer 13 is formed. Hereinafter, a patterned SOG layer will be referred as a first SOG layer 13A.

As shown in FIG. 3D, a wet etching process 18 is performed to etch the first SOG layer 13A exposed by a lower portion of the first contact hole 17 (see FIG. 3C). Hereinafter, a patterned first SOG layer will be referred to as a second SOG layer 13B. Thus, an opening 19 is formed in the second SOG layer 13B. The wet etching process 18 is performed to widen an upper area of the opening 19 to increase an overlap margin between a bottom contact plug to be formed in the second SOG layer 13B and a top contact plug to be formed over the bottom contact plug. However, during the wet etching process 18, an etching speed is much faster in the lower portion of the first SOG layer 13A than in the upper portion of the first SOG layer 13A. Accordingly, it is difficult to increase the upper area of the opening 19.

As shown in FIG. 3E, a dry etching process 20 such as an etch-back process is performed to etch a predetermined portion of the second SOG layer 13B exposed by the lower portion of the opening 19. Hereinafter, a patterned second SOG layer will be referred to as a third SOG layer 13C. As a result, a second contact hole 21 exposing a predetermined portion of the substrate 11 between the conductive layers 12 is formed in the third SOG layer 13C.

As shown in FIG. 3F, a stripping process is carrier out to remove the photoresist pattern 15 (see FIG. 3E). Afterwards, the hard mask pattern 14A (see FIG. 3E) is removed through a wet etching process. A conductive material for a plug is deposited over the third SOG layer 13C to fill the second contact hole 21 (see FIG. 3E). Afterwards, the conductive material is planarized and then, a bottom contact plug 23 is formed in the second contact hole 21.

An inter-layer insulation layer 24 is formed over the third SOG layer 13C including the bottom contact plug 23. Although not shown, a photoresist layer is formed and then, patterned by performing a photo-exposure process and a developing process to obtain a photoresist pattern 25. Afterwards, a photo-exposure process is performed to etch a predetermined portion of the inter-layer insulation layer 24 through the photoresist pattern 25. Accordingly, a third contact hole 26 is formed to expose the bottom contact plug 23. The third contact hole 26 is for a top contact plug (not shown) contacting the bottom contact plug 23.

However, since there may be a limitation in increasing an upper area of the bottom contact plug due to a characteristic of the SOG layer, the upper area of the bottom contact plug is often very small. Thus, an overlap margin between the bottom contact plug and the third contact is insufficient. Accordingly, a contact defect D between the top contact plug and the bottom contact plug may be induced. The aforementioned limitation may be more serious as semiconductor device integration increases.

SUMMARY OF THE INVENTION

It is, therefore, an object of the present invention to provide a method for fabricating a contact hole of a semiconductor device with a high aspect ratio, wherein the method can improve adhesion between a contact plug and another contact plug contacting the aforementioned contact plug by using a SOG layer having a good gap-filling property.

In accordance with one aspect of the present invention, there is provided a method for forming a contact hole of a semiconductor device, including: forming a lower pattern over a substrate; forming a spin-on-glass (SOG) layer over the lower pattern; performing a first curing process on the SOG layer; forming an opening exposing a portion of the SOG layer; performing a second curing process on the SOG layer corresponding to a lower portion of the opening; and forming a contact hole exposing the lower pattern.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

FIGS. 4A to 4F are cross-sectional views illustrating a method for fabricating a contact hole of a semiconductor device in accordance with an embodiment of the present invention.

Figure 1:
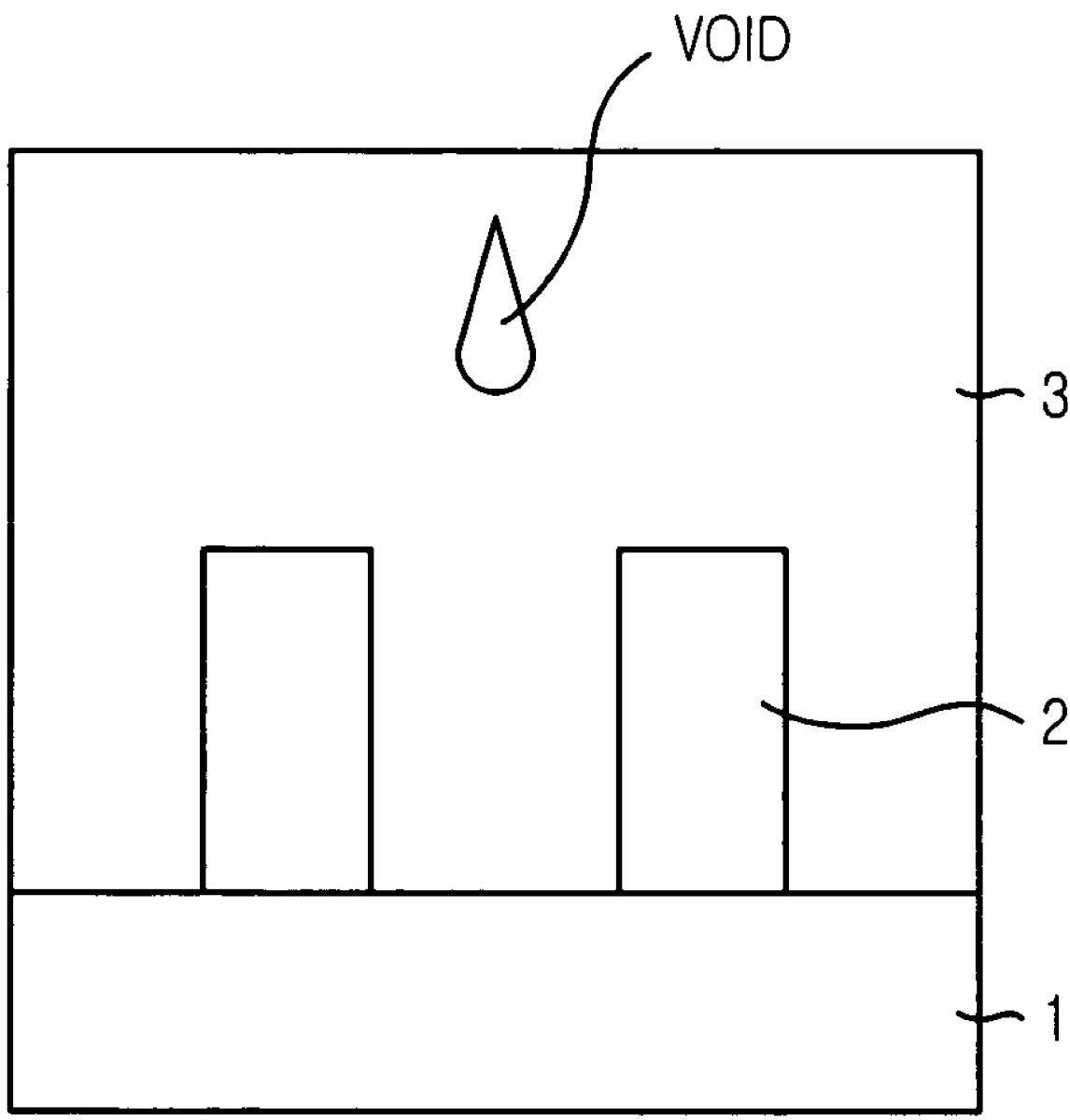
FIG. 1 illustrates a sectioned substrate structure with a degraded gap-filling property.
Figure 2:
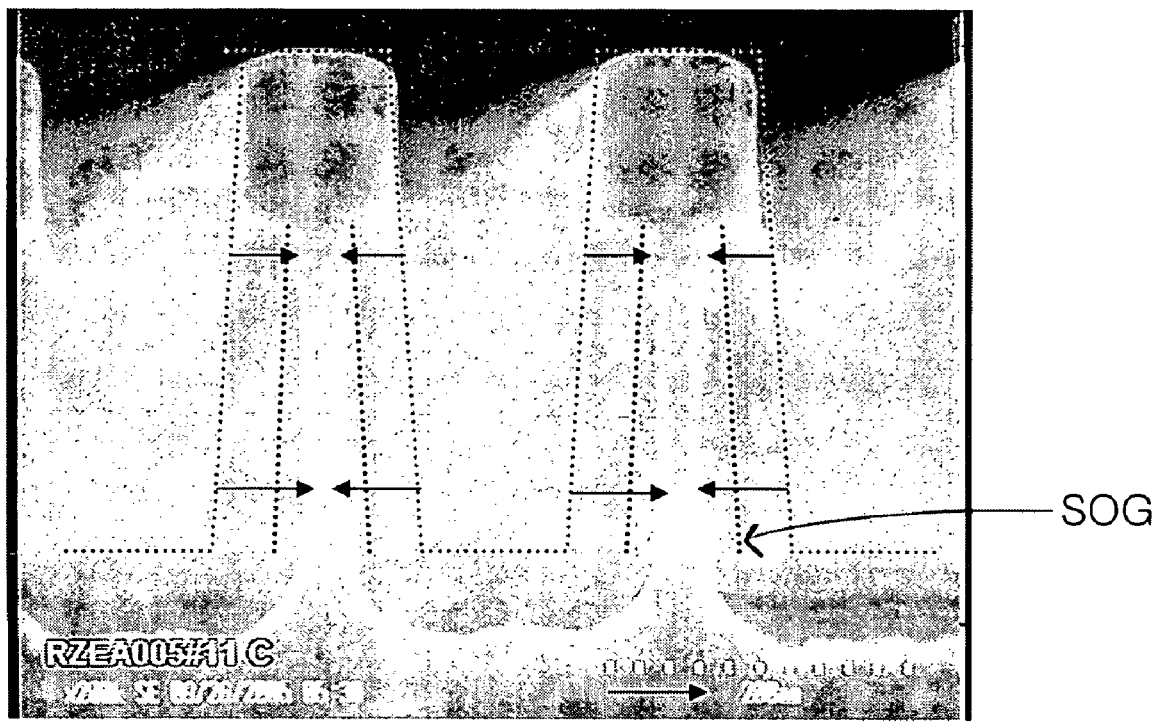
FIG. 2 illustrates a micrographic transmission electron microscopy (TEM) image of a typical SOG layer after a wet etching process.
Figure 3A:
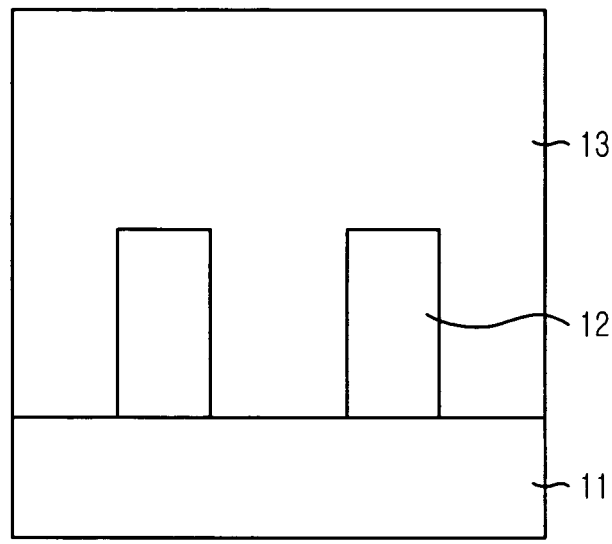
FIGS. 3A to 3F are cross-sectional views illustrating a typical method for forming a contact plug of a semiconductor device using a SOG layer.
Figure 3B:
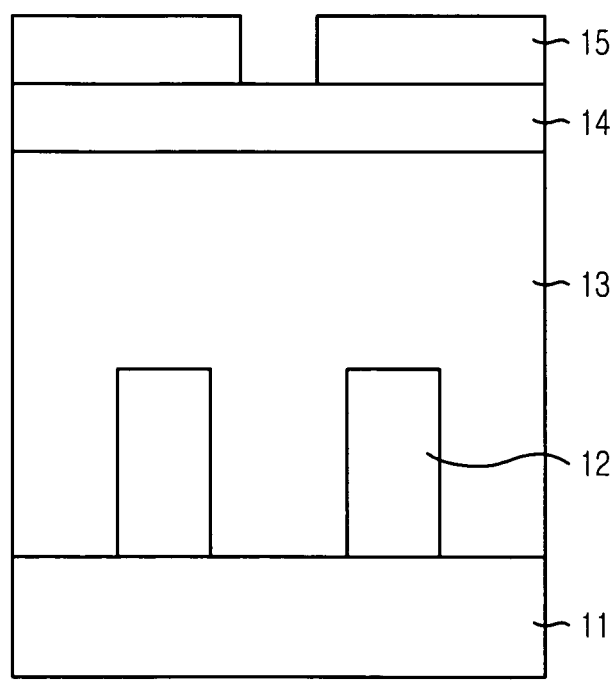
Figure 3C:
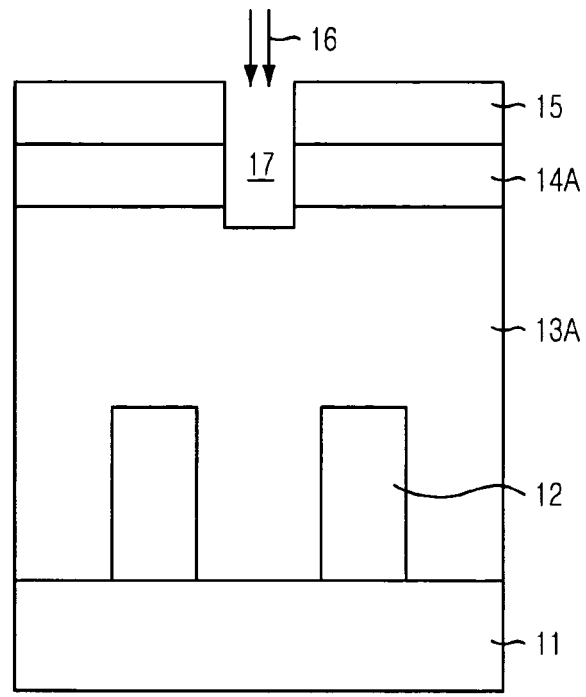
Figure 3D:
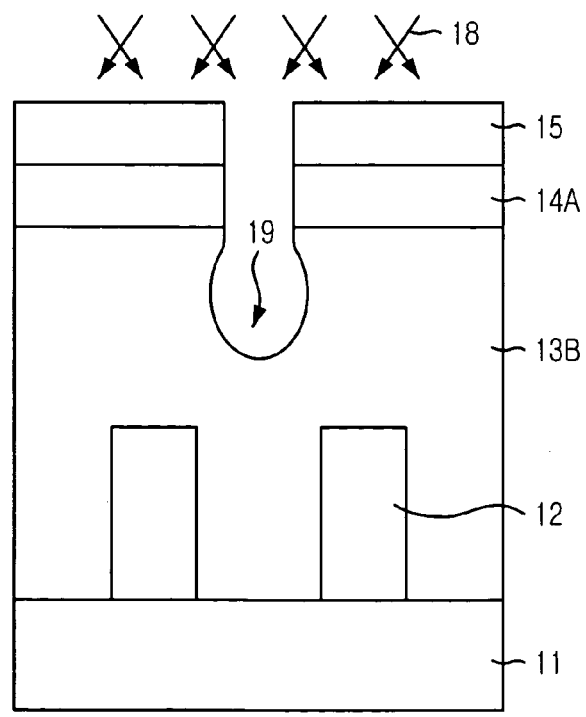
Figure 3E:
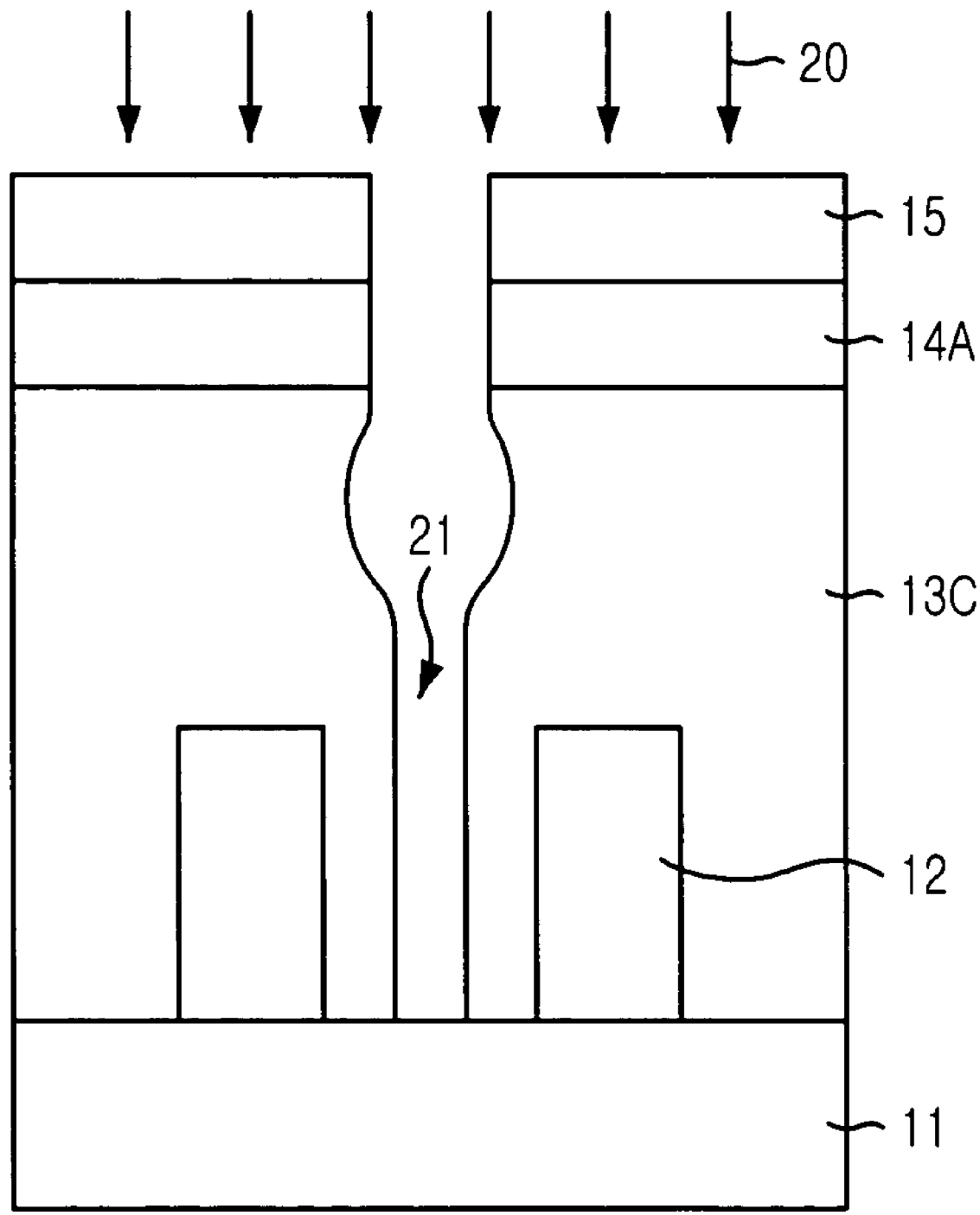
Figure 3F:
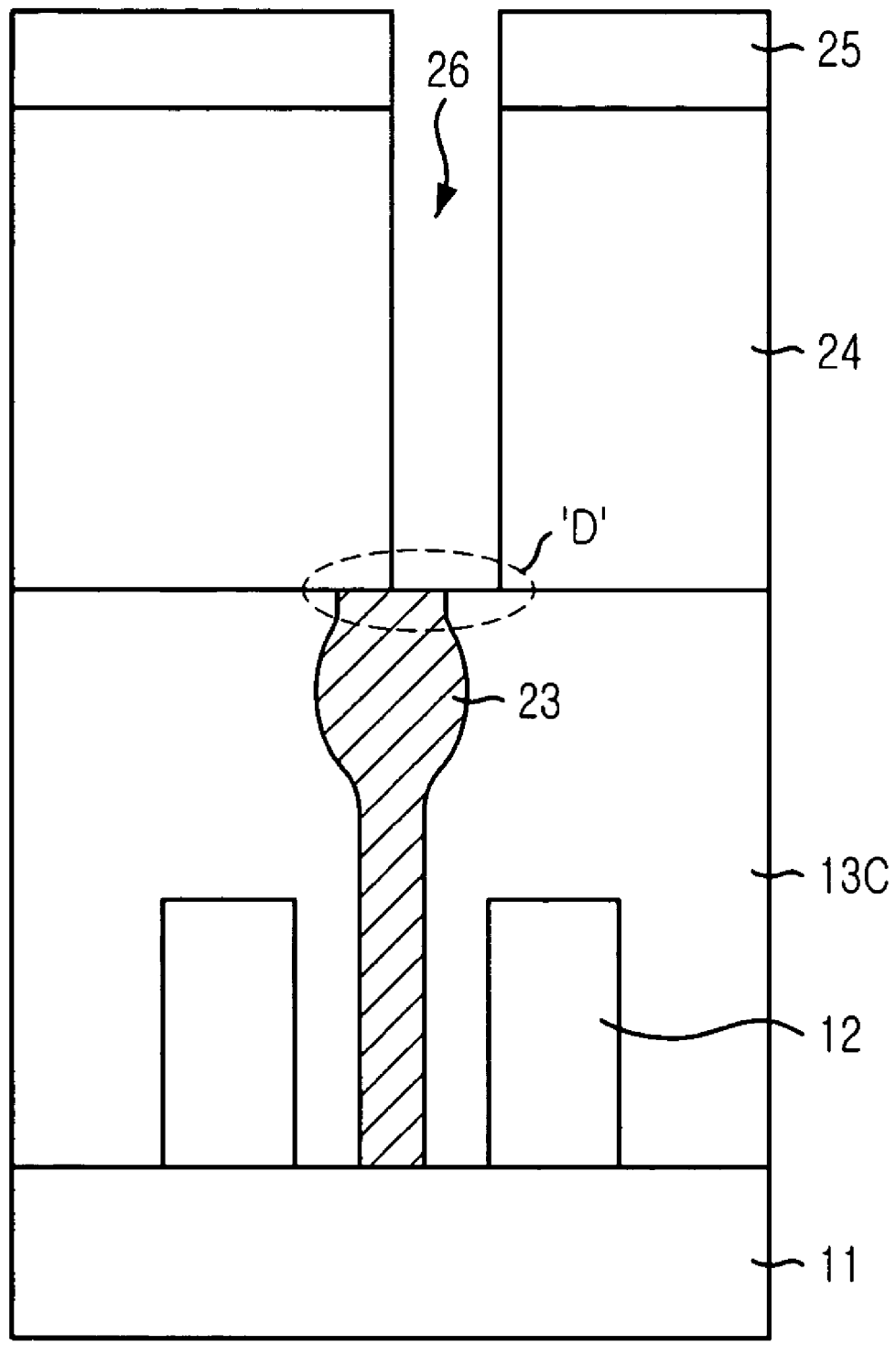
Figure 4A:
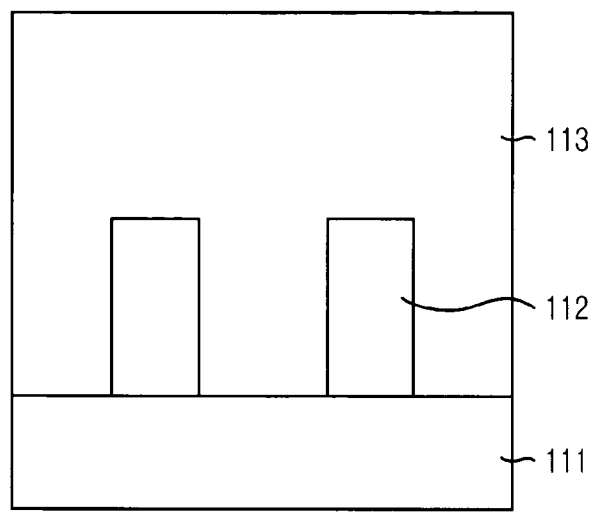
FIGS. 4A to 4F are cross-sectional views illustrating a method for fabricating a contact hole of a semiconductor device in accordance with a specific embodiment of the present invention.

As shown in FIG. 4A, a plurality of conductive layers 112 are formed over a substrate 111 in which lower layers (not shown) are formed through a series of semiconductor device fabrication processes. The lower layers may include a junction region, a conductive layer, a contact plug and an insulation layer.

A spin-on-glass (SOG) layer 113 having a good gap-filling property is formed over an upper portion of the conductive layers 112. The SOG layer 113 can fill a gap between the conductive layers 112 having a high aspect ratio, i.e., an aspect ratio equal to or more than approximately 2.5, without defects.

A first curing process is performed to densify the SOG layer 113. Through the first curing process, the SOG layer 113 becomes densified. The first curing process is carried out for approximately 10 minutes to approximately 60 minutes at approximately 600° C. to approximately 800° C. Accordingly, the SOG layer 113 can be densified up to a depth of an opening which will be formed in the SOG layer 113 through a subsequent process.

The first curing process is performed by using a gas selected from a group consisting of water ($H_2O$), oxygen ($O_2$), nitrogen ($N_2$), hydrogen ($H_2$), nitrogen dioxide ($NO_2$), and a combination thereof.

Figure 4B:
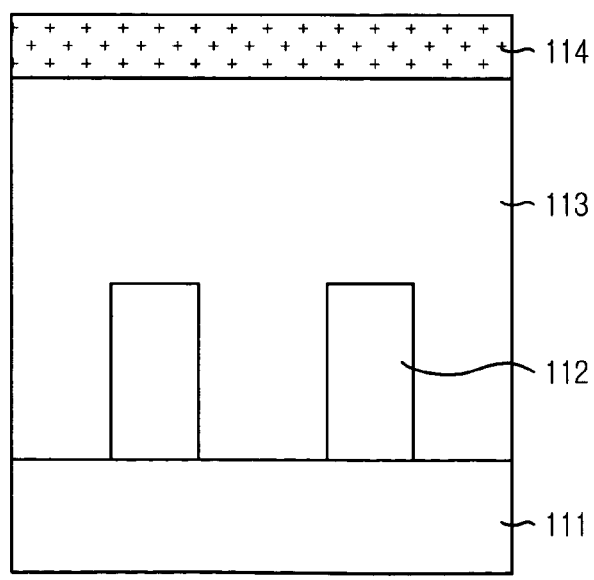

As shown in FIG. 4B, a hard mask material 114 which will be subjected to a high temperature process is formed over the SOG layer 113. For instance, a material which will be subjected to the high temperature process at approximately 500° C. or higher can be selected from a group consisting of polysilicon, a plasma-enhanced chemical vapor deposition (PE-CVD) nitride layer and tungsten. The hard mask material 114 formed with polysilicon is deposited by performing a deposition process for approximately 10 minutes to approximately 60 minutes at approximately 500° C. to approximately 600° C.

Since the high temperature process is carried out during depositing the hard mask material 114, adhesion between the hard mask material 114 and the SOG layer 113 is improved to prevent a lifting phenomenon from being typically generated.

Figure 4C:
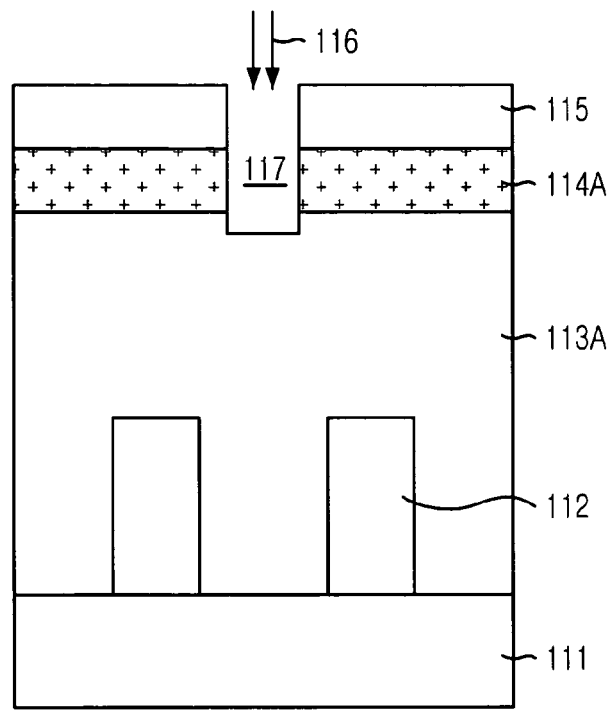

As shown in FIG. 4C, a photoresist layer (not shown) is deposited over the SOG layer 113. Afterwards, a photo-exposure process and a developing process are performed by using a photomask to form a photoresist pattern 115. The photoresist pattern 115 serves a role in defining a region in which a contact hole will be formed in the SOG layer 113. The photoresist pattern 115 is formed in a structure which opens a predetermined portion of the SOG layer 113 corresponding to a space between the conductive layers 112.

An etching process 116 is performed by using the photoresist pattern 115. Thus, the hard mask material 114 (see FIG. 4B) is etched to form a first contact hole 117 exposing the predetermined portion of the SOG layer 113. Hereinafter, the exposed SOG layer will be referred to as a first SOG layer 113A. The first contact hole 117 has a width $W_1$ (i.e., a distance between the hard mask patterns 114A). Accordingly, a hard mask pattern 114A is formed over the first SOG layer 113A.

Figure 4D:
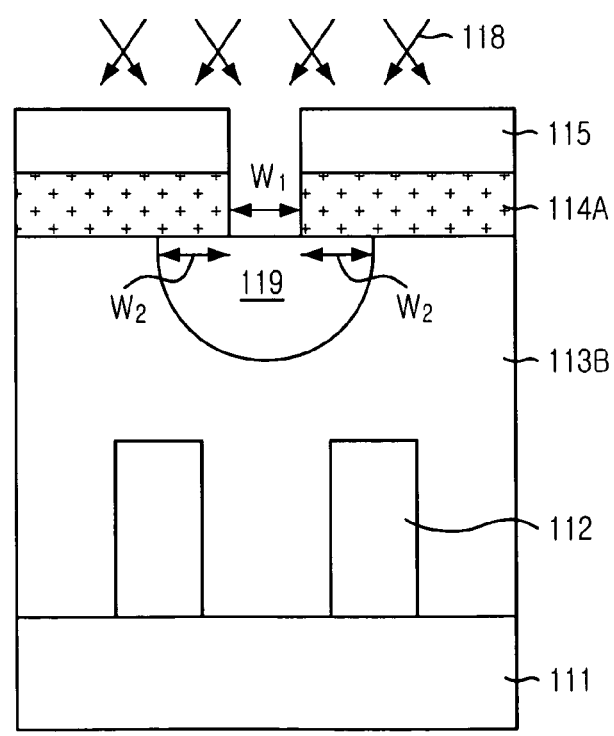

As shown in FIG. 4D, a wet etching process 118 or an isotropic etching process is performed to increase an area of the first contact hole 117 (see FIG. 4C). The wet etching process 118 etches the first SOG layer 113A exposed by a lower portion of the first contact hole 117. Hereinafter, the patterned first SOG layer through the wet etching process will be referred to as a second SOG layer 113B. Accordingly, an opening 119 having a width wider than the width $W_1$ of the first contact hole 117 is formed in the second SOG layer 113B.

The most important fact is that an upper width of the opening 119 is wider than the distance $W_1$ between the hard mask patterns 114A, i.e., the width $W_1$ of the first contact hole 117. As illustrated in FIG. 4D, the whole upper width of the opening 119 becomes $W_1+2W_2$.

As described above, during the first curing process, an upper portion of the SOG layer 113 becomes much densified than a lower portion of the SOG layer 113. Accordingly, the lower portion of the SOG layer 113 has low resistance to the wet etching process and thus, during the wet etching process, the etching process generally proceeds much faster in the lower portion of the SOG layer 113 than in the upper portion of the SOG layer 113.

However, according to this embodiment of the present invention, although the SOG layer 113 is used, the upper width of the opening 119 formed in the second SOG layer 113B can be increased. The reason is because the SOG layer 113 is densified up to the depth of the opening 119 which will be formed by performing the first curing process as shown in FIG. 4A.

Accordingly, an overlap margin between a bottom contact plug to be formed in the second SOG layer 113B and a top contact plug to be formed over the bottom contact plug is increased to improve adhesion between the top contact plug and the bottom contact plug.

A second curing process is performed to density the second SOG layer 113B. Thus, the second SOG layer 113B exposed by the lower portion of the opening 119 becomes densified.

The second curing process is carried out for approximately 10 minutes to approximately 60 minutes at approximately 600° C. to approximately 800° C. Also, the second curing process uses a gas selected from a group consisting of $H_2O$, $O_2$, $N_2$, $H_2$, $NO_2$ and a combination thereof.

Figure 4E:
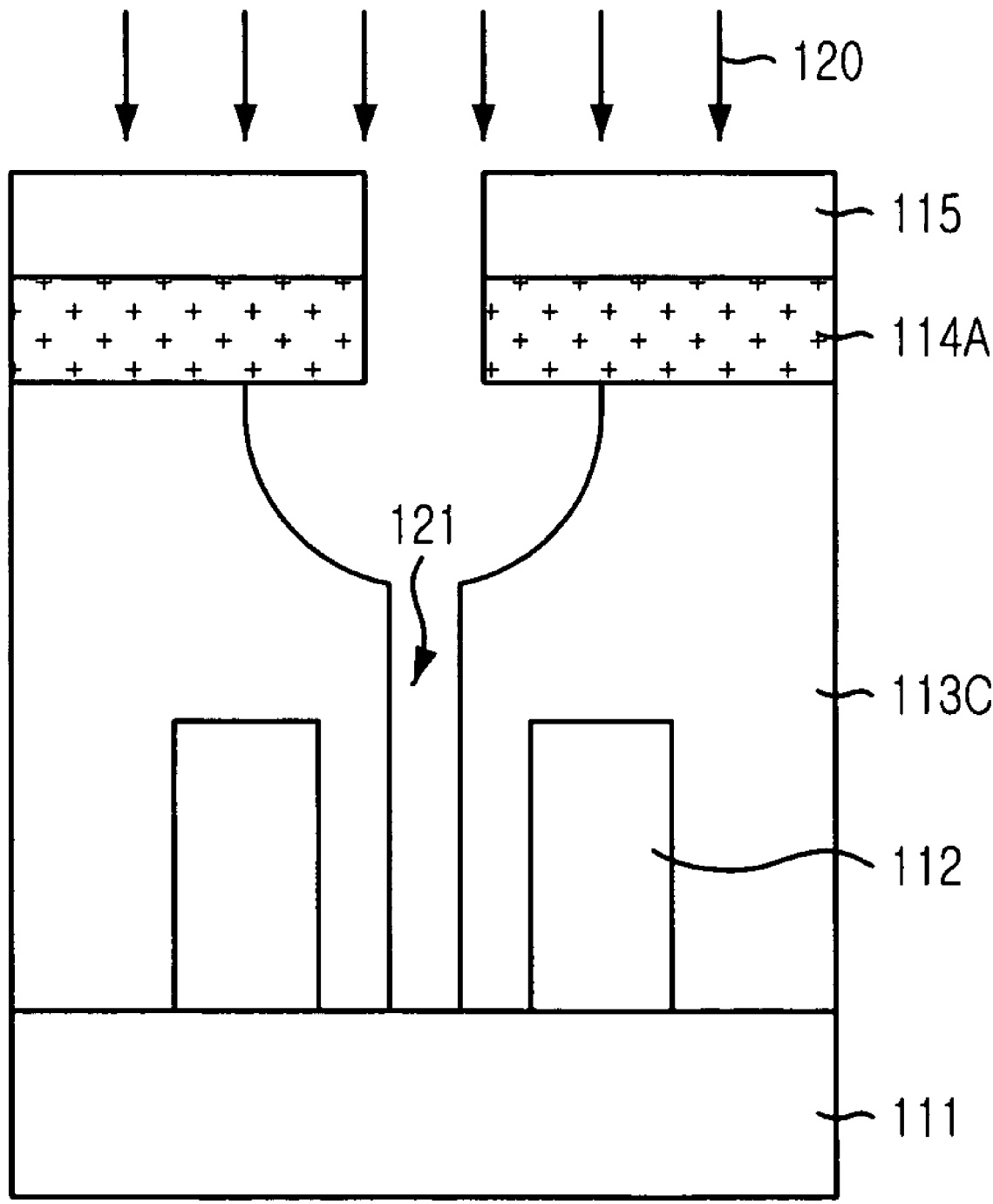

As shown in FIG. 4E, a dry etching process 120 or an anisotropic process such as an etch-back process is performed, to etch a predetermined portion of the second SOG layer 113B exposed by the lower portion of the opening 119. Hereinafter, a patterned second SOG layer will be referred to as a third SOG layer 113C. Accordingly, in the third SOG layer 113C, a second contact hole 121 exposing a predetermined portion of the substrate 111 between the conductive layers 121 is formed.

In another embodiment of the present invention, after performing the second curing process, a predetermined portion of the second SOG layer 113B exposed by the opening 119 can be etched to form another opening having a smaller width than the other opening 119.

Figure 4F:
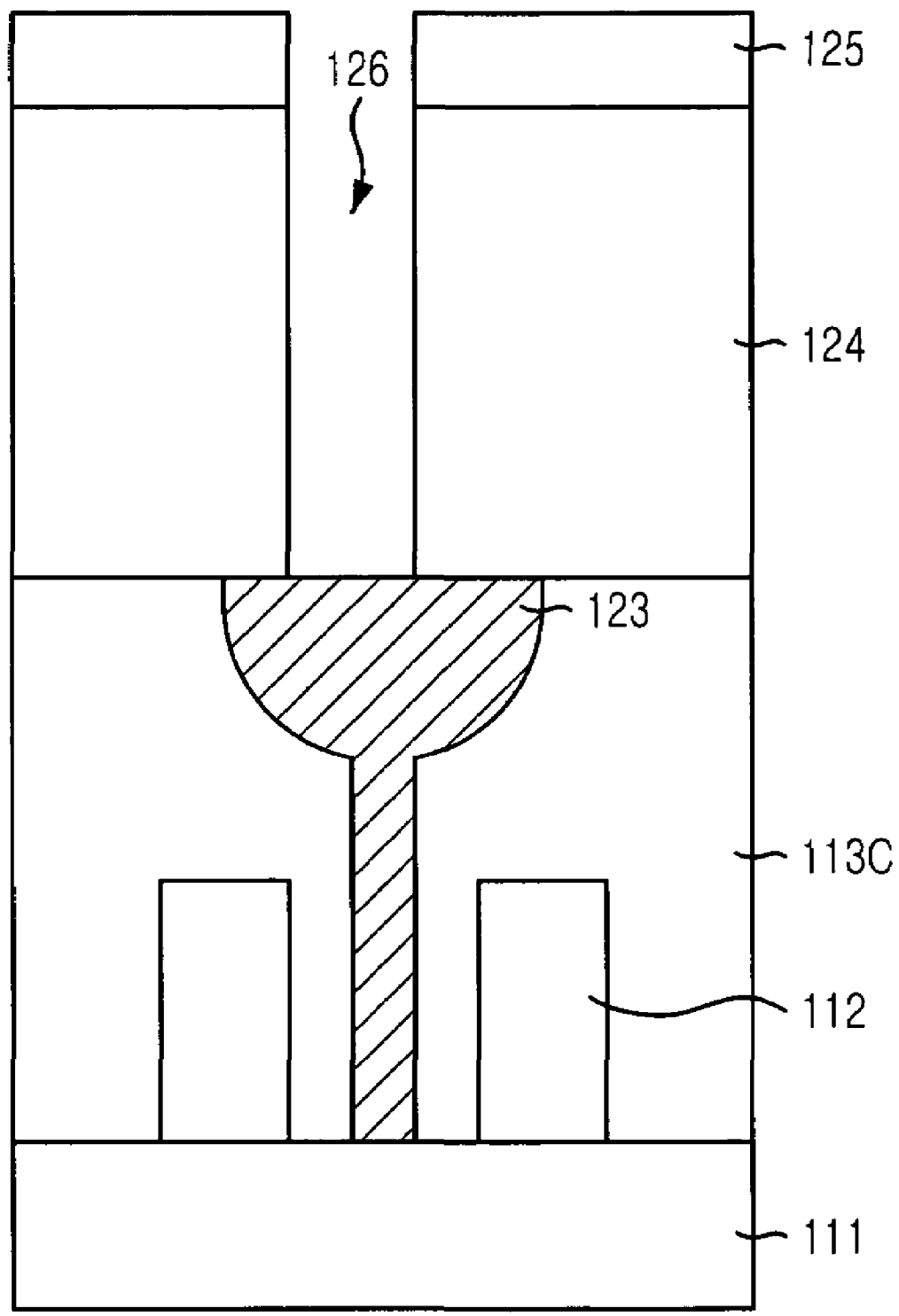

As shown in FIG. 4F, a stripping process is performed to remove the photoresist pattern 115 (see FIG. 4E). Afterwards, the hard mask pattern 114A (see FIG. 4E) is removed through a wet etching process.

A conductive material for a plug is deposited over the third SOG layer 113C to bury the second contact hole 121 (see FIG. 4E). Then, a chemical mechanical polishing (CMP) process is performed, thereby planarizing the conductive material. Thus, a bottom contact plug 123 is formed in the second contact hole 121.

An inter-layer insulation layer 124 is formed over the third SOG layer 113C including the bottom contact plug 123. Although not shown, a photoresist layer is formed and then, patterned by using a photo-exposure process and a developing process. Thus, a photoresist pattern 125 is obtained. Afterwards, a predetermined portion of the inter-layer insulation layer 124 is etched through the photoresist pattern 125 formed by the photo-exposure process. Accordingly, a third contact hole 126 to expose the bottom contact plug 123 is formed.

The third contact hole 126 is obtained to form a top contact plug (not shown) in contact with the bottom contact plug 123.

Furthermore, the inter-layer insulation layer 124 can be formed with an oxide-based material. For instance, the inter-layer insulation layer 124 can be formed by using one selected from a group consisting of a high density plasma (HDP) oxide layer, a borophosphosilicate glass (BPSG) layer, a phosphosilicate glass (PSG) layer, a plasma enhanced tetraethylorthosilicate (PETEOS) layer, a plasma enhanced chemical vapor deposition (PECVD) layer, a undoped silicate glass (USG) layer, a fluorinated silicate glass (FSG) layer, a carbon doped oxide (CDO) layer, an organic silicate glass (OSG) layer, and a combination thereof.

According to this embodiment of the present invention, during fabricating highly integrated semiconductor devices by using a SOG layer having a good gap-filling property, a SOG layer is formed and then, a curing process is carried out to densify the SOG layer up to a predetermined depth. Then, a wet etching process is performed to form an opening with a certain depth within the densified SOG layer. Afterwards, a contact hole is formed with a width smaller than that of the opening formed within the densified SOG layer. Thus, it becomes possible to selectively increase an upper area of the contact hole formed in the densified SOG layer to make different contact plugs in contact with each other. Accordingly, it is possible to improve adhesion between a contact plug formed in the contact hole in the densified SOG layer and another contact plug contacted with the aforementioned contact plug.

The present application contains subject matter related to the Korean patent application No. KR 2005-0127656, filed in the Korean Patent Office on Dec. 22, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a contact hole of a semiconductor device, comprising:
    forming a lower pattern over a substrate;
    forming a spin-on-glass (SOG) layer over the lower pattern;
    performing a first curing process on the SOG layer;
    forming an opening exposing a portion of the SOG layer;
    performing a second curing process on the SOG layer corresponding to a lower portion of the opening; and
    forming a contact hole exposing the lower pattern,
    wherein the forming of the opening comprises forming a hard mask pattern over the SOG layer and selectively removing a predetermined portion of the SOG layer, and
    wherein the selectively removing of the predetermined portion of the SOG layer comprises an isotropic etching process.

2. The method of claim 1, wherein the selectively removing of the predetermined portion of the SOG layer comprises performing a wet etching process.

3. The method of claim 1, wherein the forming of the hard mask pattern is performed at a temperature ranging from approximately 500° C. to approximately 600° C. for approximately 10 minutes to approximately 60 minutes.

4. The method of claim 1, wherein the forming of the hard mask pattern comprises using one of polysilicon, a plasma enhanced chemical vapor deposition (PECVD) nitride layer, and tungsten.

5. The method of claim 1, wherein the first curing process and the second curing process are performed at a temperature ranging from approximately 600° C. to approximately 800° C. for approximately 10 minutes to approximately 60 minutes.

6. The method of claim 1, wherein the first curing process and the second curing process uses a gas selected from a group consisting of water ($H_2O$), oxygen ($O_2$), nitrogen ($N_2$), hydrogen ($H_2$), nitrogen dioxide ($NO_2$), and a combination thereof.

7. The method of claim 1, wherein the forming of the contact hole comprises anisotropically etching a predetermined portion of the SOG layer exposed by the opening.

8. The method of claim 1, wherein the forming of the contact hole comprises dry etching a predetermined portion of the SOG layer exposed by the opening.

9. The method of claim 1, wherein the contact hole has a width smaller than that of the opening.

10. The method of claim 1, further comprising, after the performing of the second curing process, selectively removing a portion of the remaining SOG layer to form another opening.

11. The method of claim 10, wherein the other opening has a width smaller than that of the opening.

12. The method of claim 10, wherein the first curing process and the second curing process are performed at a temperature ranging from approximately 600° C. to approximately 800° C. for approximately 10 minutes to approximately 60 minutes.

13. The method of claim 10, wherein the first curing process and the second curing process uses a gas selected from a group consisting of water ($H_2O$), oxygen ($O_2$), nitrogen ($N_2$), hydrogen ($H_2$), nitrogen dioxide ($NO_2$), and a combination thereof.

* * * * *